United States Patent
Ahn (10) Patent No.: US 11,359,968 B2
(45) Date of Patent: Jun. 14, 2022

(54) APPARATUS AND METHOD FOR ADJUSTING INSTALLATION LOCATION OF TEMPERATURE SENSOR CONFIGURED TO MEASURE SURFACE TEMPERATURE OF WAFER IN SEMICONDUCTOR WAFER CLEANING APPARATUS

(71) Applicants: Jongpal Ahn, Yongin-si (KR); AJ TECH CO., LTD., Yongin-si (KR)

(72) Inventor: Jongpal Ahn, Yongin-si (KR)

(73) Assignees: Jongpal Ahn, Yongin-si (KR); AJ TECH CO., LTD., Yongin-si (KR)

( * ) Notice: Subject to any disclaimer, the term of this patent is extended or adjusted under 35 U.S.C. 154(b) by 530 days.

(21) Appl. No.: 16/581,922

(22) Filed: Sep. 25, 2019

(65) Prior Publication Data

US 2020/0116570 A1 Apr. 16, 2020

(30) Foreign Application Priority Data

Oct. 15, 2018 (KR) .......................... 10-2018-0122351

(51) Int. Cl.
*H01L 21/02* (2006.01)
*H01L 21/67* (2006.01)
(Continued)

(52) U.S. Cl.
CPC ............ *G01J 5/0205* (2013.01); *B08B 1/001* (2013.01); *H01L 21/02065* (2013.01);
(Continued)

(58) Field of Classification Search
None
See application file for complete search history.

(56) References Cited

U.S. PATENT DOCUMENTS

2012/0251759 A1* 10/2012 Yamawaku ............... G01K 5/48
374/161
2013/0152605 A1* 6/2013 Mimata ............. H01L 21/67109
62/3.3
(Continued)

FOREIGN PATENT DOCUMENTS

JP H04-121734 U 10/1992
KR 10-0636016 B1 10/2006
(Continued)

*Primary Examiner* — Alexander G Ghyka
(74) *Attorney, Agent, or Firm* — Korus Patent, LLC; Seong Il Jeong (57) ABSTRACT

Disclosed herein is an apparatus for adjusting the installation location of a temperature sensor configured to measure the surface temperature of a wafer in a semiconductor wafer cleaning apparatus. The apparatus includes: a bracket which is disposed in the upper end of the side wall of each of multi-station processing chambers (MPCs); a first fastening member which fastens a cable; a second fastening member which fastens a temperature sensor; a location adjustment member which fastens and supports the temperature sensor; the temperature sensor which is fixedly coupled to an end of the location adjustment member; a jig which includes a location adjustment plate and a control substrate, and which adjusts the detection location of the temperature sensor; and a controller which is provided with a wafer surface monitoring system configured to separate the surface temperature into a plurality of channels and to display the surface temperature.

5 Claims, 6 Drawing Sheets

(51) Int. Cl.
*H01L 21/66* (2006.01)
*G01J 5/02* (2022.01)
*B08B 1/00* (2006.01)
*B24B 37/015* (2012.01)

(52) U.S. Cl.
CPC .. *H01L 21/67051* (2013.01); *H01L 21/67248* (2013.01); *H01L 21/67259* (2013.01); *H01L 22/12* (2013.01); *H01L 22/20* (2013.01); *H01L 22/26* (2013.01); *H01L 22/30* (2013.01); *B24B 37/015* (2013.01)

(56) References Cited

U.S. PATENT DOCUMENTS

| | | | | |
|---|---|---|---|---|
| 2014/0262199 | A1* | 9/2014 | Kobayashi | H01L 21/67103 165/61 |
| 2018/0269090 | A1* | 9/2018 | Kobayashi | H01L 21/6831 |
| 2019/0301947 | A1* | 10/2019 | Yamasaki | G01K 7/02 |
| 2020/0118848 | A1* | 4/2020 | Ahn | H01L 21/67051 |

FOREIGN PATENT DOCUMENTS

| | | | | |
|---|---|---|---|---|
| KR | 20070042270 | * | 4/2007 | ....... H01L 21/68333 |
| KR | 10-2016-0138194 A | | 12/2016 | |
| KR | 10-2018-0045852 A | | 5/2018 | |
| KR | 10-2018-0116827 A | | 10/2018 | |

* cited by examiner

APPARATUS AND METHOD FOR ADJUSTING INSTALLATION LOCATION OF TEMPERATURE SENSOR CONFIGURED TO MEASURE SURFACE TEMPERATURE OF WAFER IN SEMICONDUCTOR WAFER CLEANING APPARATUS

CROSS-REFERENCE TO RELATED APPLICATION

This application claims the benefit of Korean Patent Application No. 10-2018-0122351 filed on Oct. 15, 2018, which is hereby incorporated by reference herein in its entirety.

BACKGROUND

1. Technical Field

The present invention relates to an apparatus and method for installing a temperature sensor configured to measure the surface temperature of a wafer in a semiconductor wafer cleaning apparatus and adjusting the location of the temperature sensor.

2. Description of the Related Art

Generally, as the degree of integration of semiconductor devices fabricated on semiconductor wafers has increased, a multilayer wiring process has been performed. Accordingly, the differences in the height of interlayer insulating films between multi-layer wirings increase, and thus the planarization work becomes more important. Moreover, as a manufacturing technology for planarizing a surface of a wafer, chemical mechanical polishing (CMP) is a technology for mechanically planarizing the uneven portions of the surface of a wafer by moving a platen and a polishing head relative to each other while chemically reacting the surface of the wafer by supplying a slurry in a state of maintaining the wafer in contact with the surface of a polishing pad.

Conventionally, in the process of removing metal and organic contaminants from a surface of a semiconductor wafer using CMP equipment, when the surface of a wafer reaches a certain temperature or higher due to a chemical reaction and friction, a problem arises in that yield is significantly reduced due to defects of wafers.

Furthermore, technologies for cleaning a surface of a wafer in a semiconductor wafer cleaning apparatus are basically divided into wet cleaning and dry cleaning. Although a cleaning process is considerably similar to an etching process in that they remove material on a surface of a semiconductor wafer, they are different in that the cleaning process is intended to remove impurities on a surface of a wafer. The impurities include films, individual particles or agglomerates of particles, adsorbed gases, etc., which have material properties such as those of atoms, ions, molecules, and the like. Although conventional silicon wafer cleaning methods were mostly chemical wet cleaning using hydrogen peroxide ($H_2O_2$) solutions, cleaning technology has been gradually changed from chemical wet cleaning to dry cleaning due to the excessive consumption of chemicals, the disposal of used materials, and incompatibility with other manufacturing processes. First, the wet cleaning of a silicon wafer will be described. The technology used for the longest period is RCA cleaning, which is the most common method used for wet chemical cleaning. Solutions used for RCA cleaning include high-purity deionized (DI) water, hydrogen peroxide ($H_2O_2$), ammonium hydroxide ($NH_4OH$), and hydrochloric acid (HCl). This method usually consists of two steps: RCA Standard Clean 1 (SC-1) and RCA Standard Clean 2 (SC-2). At the first step, surface organic materials are oxidized and dissolved due to strong oxidation, and residual metallic impurities (Au, Ag, Cu, Ni, Cd, Zn, Co, Cr, etc.) are also removed. At the second step, hydroxides, i.e., $Al(OH)_3$, $Fe(OH)_3$, $Mg(OH)_2$, and $Zn(OH)_2$, which are insoluble in alkali ions (Al3+, Fe3+, and Mg2+) and $NH_4OH$, and remaining materials which have not been removed until then are removed. In some cases, a dilute hydrofluoric acid (HF) solution may be used to effectively remove the hydroxides produced after the first step. In this case, changes in the temperature of a cleaning solution produce various important effects. That is, as the temperature increases, the reaction rate of chemicals also increases. Accordingly, as the temperature rises by about 10° C., the reaction rate will be doubled. In addition, an increase in the temperature generally increases the solubility of contaminants, thus making cleaning faster. Furthermore, an increase in the temperature may cause the plating of metal composites on a surface of a wafer. In addition, a cleaning action occurs only when the cleaning solution is well adsorbed on a surface of a wafer. Therefore, the adhesion state of the cleaning solution onto a surface of a wafer is also an important factor to be considered for the improvement of a cleaning effect. When the surface tension of a wafer, which is a solid, is similar to that of a cleaning solution, which is a liquid or the surface tension of the solid is higher than that of the liquid, the adhesion of the liquid onto a surface of the solid occurs well. In general, many organic solvents have lower surface tension than inorganic solutions, and thus adhere well onto wafers. Depending on whether a surface to be cleaned is hydrophilic or hydrophobic, the choice of solvent and additives must vary.

Meanwhile, drying a wafer is the last important step of a cleaning process of successfully removing contaminants. Water must be forcibly removed out of a wafer before it can evaporate while leaving impurities on a surface of the wafer. Commonly used drying methods include centrifugation, steam drying, and hot-DI water drying.

Although wet cleaning has been commonly used for processes of manufacturing integrated circuits method, it has many problems in that incompatibility between processes occurs in the process integration between a wafer cleaning process and other integrated circuit manufacturing processes, the aspect ratios of wafer surface models to be cleaned are increased, it is difficult to remove impurities from chemical solutions, high-purity chemical materials and DI-water are expensive, and used wastes need to be processed. In order to overcome these problems, dry wafer cleaning technologies have been rapidly developed. In dry cleaning, contaminates are removed by determined steps. In addition, there is steam cleaning. Unlike dry cleaning in which cleaning is performed by a surface chemical reaction or a physical method promoted by plasma, ion bombardment, electrons, or photons, steam cleaning separates contaminants by evaporating a cleaning solution and bringing generated vapor into contact with a surface of a substrate. Steam cleaning has many of the general advantages of dry cleaning than wet cleaning, and thus steam cleaning is advantageous in that contamination attributable to the remaining of a cleaning solution itself can be prevented, accurate control can be performed, waste can be easily processed, stability can be improved by computer control, the various types of steam and various changes in temperature and pressure of steam can be handled, and an in-situ process can be easily implemented. As a result, steam cleaning is a technology which has been widely adopted in recent years.

As an art related to the present invention, Korean Patent Application Publication No. 10-2016-0138194 discloses a method of measuring the temperature of semiconductor workpiece using an infrared rays, the method further including a step of processing a workpiece after a recording step, the processing step including: a step of locating the workpiece on a heated platen; a step of waiting for a predetermined period of time; and a step of processing the workpiece after the waiting step; wherein the predetermined period of time is determined based on a recorded time it takes for the workpiece to reach the predetermined temperature.

SUMMARY

The present invention has been conceived to overcome the above-described problems, and an object of the present invention is to, in a process of cleaning a surface of a wafer with a semiconductor wafer cleaning apparatus, install a temperature sensor configured to measure the surface temperature of the wafer in real time inside a chamber, adjust the photographing location of the temperature sensor by using a laser beam emitter and a jig, and allow temperature in a corresponding heat zone to be displayed through a graphical user interface via a monitor.

Another object of the present invention is to, in a process of polishing a semiconductor wafer, install a temperature sensor configured to measure the surface temperature of a polishing pad in real time inside a chamber, adjust the photographing location of the temperature sensor by using a laser beam emitter and a jig, and allow temperature in a corresponding heat zone to be displayed through a graphical user interface via a monitor.

In order to accomplish the above objects, the present invention provides an apparatus for adjusting the installation location of a temperature sensor configured to measure the surface temperature of a wafer in a semiconductor wafer cleaning apparatus, the apparatus including: a bracket which is disposed in the upper end of the side wall of each of multi-station processing chambers (MPCs) in a semiconductor wafer cleaning apparatus, and which is provided with a first coupling hole and a second coupling hole; a first fastening member which is inserted into the first coupling hole formed in the bracket, and which fastens a cable configured to transmit and receive data between the temperature sensor and a controller; a second fastening member which is inserted into the second coupling hole formed in the bracket, and which fastens a temperature sensor; a location adjustment member which is disposed under the second fastening member, and which fastens and supports the temperature sensor; the temperature sensor which is fixedly coupled to an end of the location adjustment member, which is provided with a camera configured to wirelessly detect temperature, and which transmits and receives data to and from the controller; a jig in the top of which is provided a location adjustment plate configured to adjust the detection location of the temperature sensor, in the bottom of which is coupled a control substrate configured to operate the location adjustment plate, and which is inserted into the platen of the MPC and adjusts the detection location of the temperature sensor; and a controller which is provided with a wafer surface monitoring system configured to separate the surface temperature, photographed by the temperature sensor, into a plurality of channels and to display the surface temperature through a graphical user interface (GUI) via a monitor.

The jig may include: angle gradations which are marked on the edge of the location adjustment plate up to 360 degrees; coordinate gradations which are marked at predetermined intervals in an area extending up, down, left and right from the central point of the location adjustment plate; heating elements which are mounted into the control substrate, which emit heat up to a predetermined temperature, and which are disposed through first through holes formed at predetermined intervals to a left and right from the central point of the location adjustment plate; on/off switches which are mounted into the control substrate, which selectively turn on and off operations of the heating elements, and which are disposed through second through holes at predetermined intervals on one side of the first through holes; and a reset switch which is mounted into the control substrate, which initializes settings, and which is disposed through a third through hole formed on one side of the edge of the location adjustment plate.

The location adjustment member may be hinged to the second fastening member configured to fasten the temperature sensor to the bracket in order to enable the location of the location adjustment member to be adjusted to a predetermined angle up, down, left, and right.

In order to accomplish the above objects, the present invention provides a method of adjusting the installation location of a temperature sensor configured to measure the surface temperature of a wafer in a semiconductor wafer cleaning apparatus, the method including: (a) turning on a laser beam emitter mounted into a temperature sensor; (b) adjusting a location adjustment member so that a beam point projected from the laser beam emitter is located at a set angle gradation of angle gradations marked on the location adjustment plate surface of a jig, and also adjusting the location adjustment member so that a beam point projected from the laser beam emitter is located at a set coordinate gradation of coordinate gradations marked on the location adjustment plate surface of the jig; (c) turning on a center switch, a right intermediate switch, and a right edge switch or the center switch, a left intermediate switch, and a left edge switch in order to operate heating elements corresponding to a heat zone of the jig; (d) separating the surface temperature of the jig, photographed by a camera of the temperature sensor, into a predetermined number of channels and displaying the surface temperature of the jig through a graphical user interface (GUI) via a monitor, by means of a wafer surface monitoring system installed on a controller in an application form; and (e) determining the heat zone of the jig displayed through the graphical user interface via the monitor, and adjusting a sensor value so that the temperature of the heat zone corresponding to a center point, a right intermediate point, and a right edge point is measured as a predetermined temperature or so that the temperature of the heat zone corresponding to the center point, a left intermediate point, and a left edge point is measured as a predetermined temperature.

The wafer surface monitoring system may perform adjustment so that the temperature of the heat zone corresponding to the center point, the right intermediate point, the left intermediate point, the right edge, and the left edge ranges from 25 to 120° C. and an allowable range is measured as a range of ±1 to 0.25° C.

BRIEF DESCRIPTION OF THE DRAWINGS

The above and other objects, features, and advantages of the present invention will be more clearly understood from the following detailed description taken in conjunction with the accompanying drawings, in which.

DETAILED DESCRIPTION

An embodiment of an apparatus for adjusting the installation location of a temperature sensor configured to measure the surface temperature of a wafer in a semiconductor wafer cleaning apparatus according to the present invention will be described in detail below with reference to the accompanying drawings.

Figure 1:
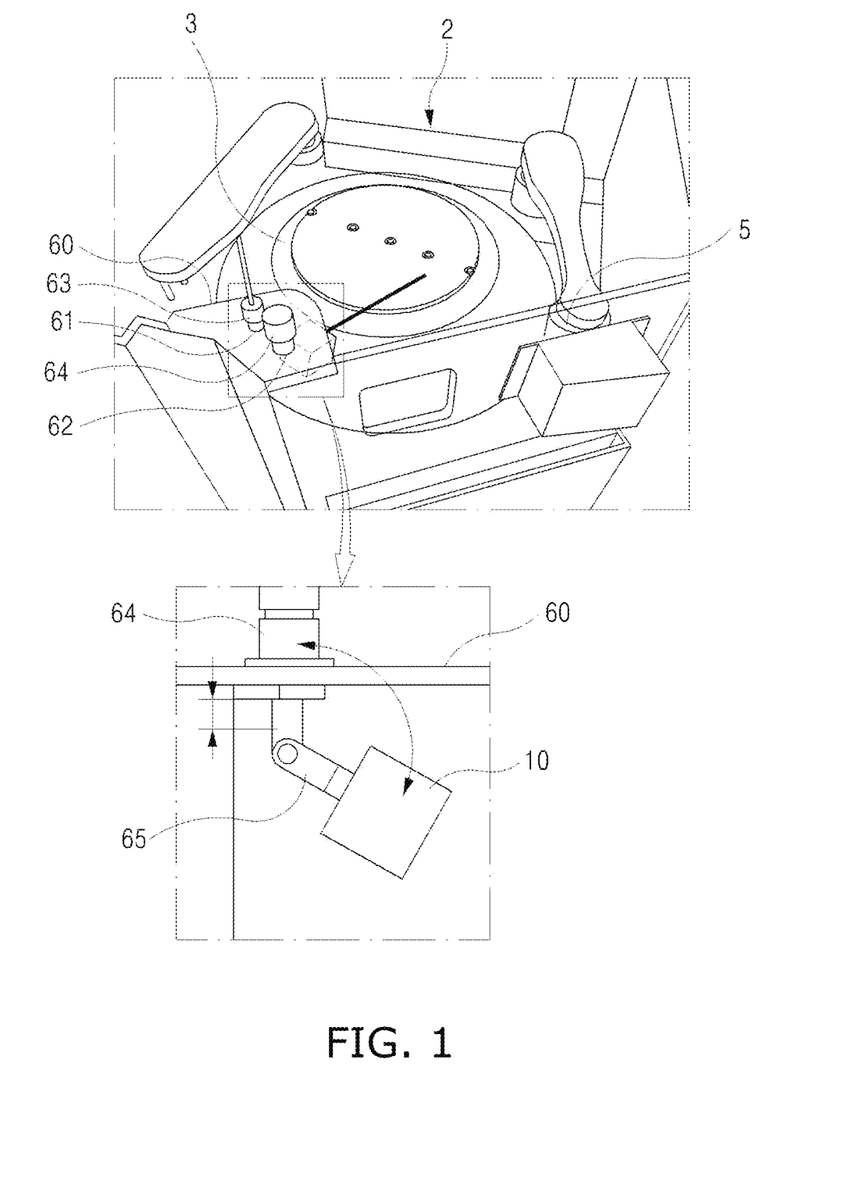
FIG. 1 is a diagram showing an apparatus for adjusting the installation location of a temperature sensor configured to measure the surface temperature of a wafer in a semiconductor wafer cleaning apparatus according to an embodiment of the present invention.

As shown in FIG. 1, a bracket 60 is disposed at the upper end of a side wall inside a multi-station processing chamber (MPC) in a semiconductor wafer cleaning apparatus 1. The bracket 60 is provided with: a first coupling hole 61 through which a cable configured to be connected to a temperature sensor 10 and to transmit and receive signals; and a second coupling hole 62 which fastens and supports the temperature sensor 10.

Furthermore, a first fastening member 63 is inserted into the first coupling hole 61 formed in the bracket 60, and fastens the cable configured to transmit and receive data between the temperature sensor 10 and the controller. Furthermore, a second fastening member 64 is inserted into the second coupling hole formed in the bracket 60, and fastens the temperature sensor 10.

Furthermore, a location adjustment member 65 is installed under the second fastening member 64, and fastens and supports the temperature sensor 10. The location adjustment member 65 is preferably hinged to the second fastening member 64 in order to adjust the temperature sensor 10 up, down, left, and right.

Figure 3:
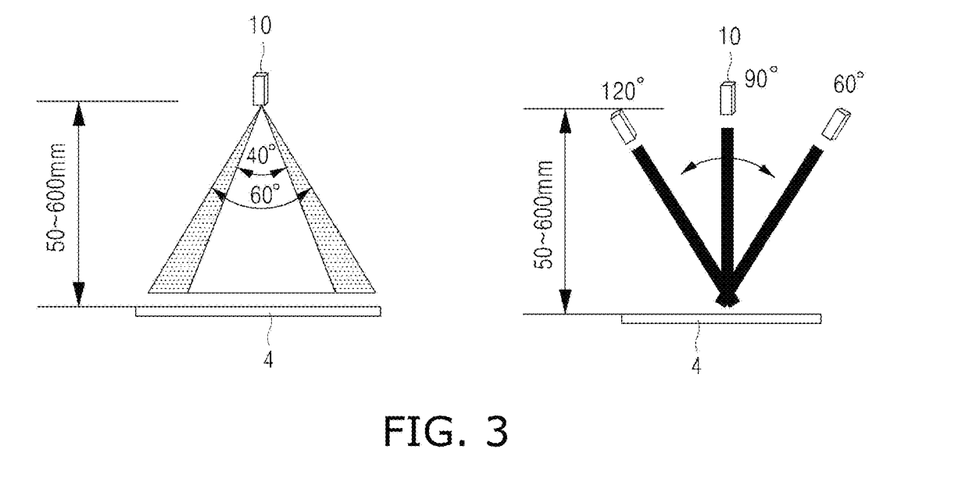
FIG. 3 shows an example of the measurement angle and installation angle of a temperature sensor configured to measure the surface temperature of a wafer in a semiconductor wafer cleaning apparatus according to the present invention.
Figure 5:
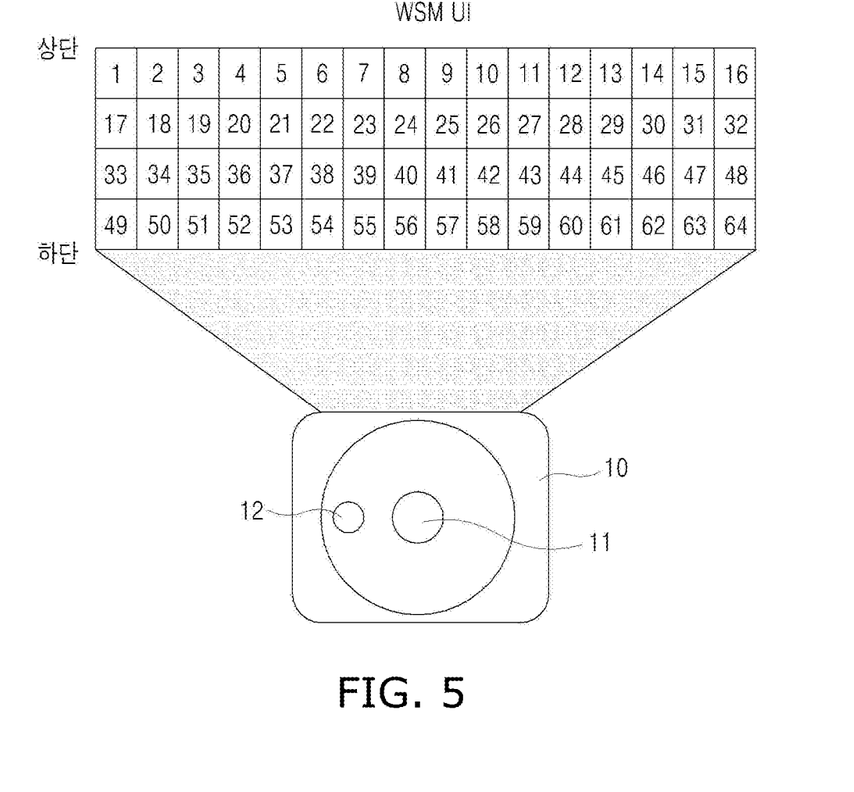
FIG. 5 shows an example of the graphical user interface of a temperature sensor configured to measure the surface temperature of a wafer in a semiconductor wafer cleaning apparatus according to the present invention.

As shown in FIG. 5, the temperature sensor 10 is installed inside the MPC 2 installed in the semiconductor wafer cleaning apparatus 1. The temperature sensor 10 is a non-contact sensor, and an infrared camera may be applied as the temperature sensor 10. Furthermore, the temperature sensor 10 detects temperatures in multiple areas, and detects temperatures in 64 areas (64 CHs) obtained by dividing the surface of wafer. The temperature sensor 10 is installed on one side of the upper portion of each chamber 2, and detects the temperature of the surface of a wafer 4 inserted into a platen 3. The temperature sensor 10 has an operating range of about −30 to 120 degrees and a temperature measurement range of about −70 to 380 degrees. Furthermore, in FIG. 3, the temperature sensor 10 has a measurement distance range of about 50 to 600 mm and a measurement angle range of about 40 to 60 degrees. The installation angle between the wafer, which is a detection target, and the temperature sensor 10 ranges from about 60 to 120 degrees. Furthermore, the temperature sensor 10 may communicate over an Ethernet, or may communicate in a USB or wireless manner. The temperature sensor 10 wirelessly transmits and receives information data on the detected temperature of the surface of a wafer to and from a controller 30.

Figure 4:
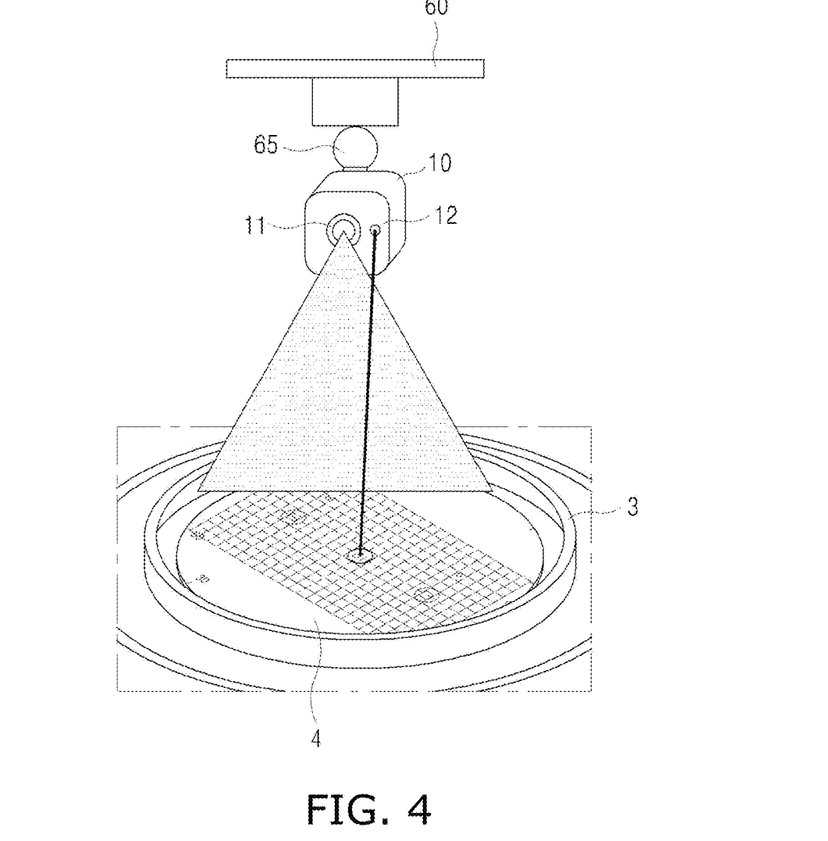
FIG. 4 shows an example of a method of adjusting the location of a temperature sensor configured to measure the surface temperature of a wafer in a semiconductor wafer cleaning apparatus according to the present invention.

Furthermore, as shown in FIG. 4, the temperature sensor 10 is integrated with a laser beam emitter 12. The laser beam emitter 12 is fixedly coupled to an end of the location adjustment member 65, and is used to adjust the location of the temperature sensor 10. Additionally, the laser beam emitter 12 is used to adjust both the installation location of the temperature sensor 10 and the photographing location thereof so that the temperature sensor 10 can accurately detect the temperature of the surface of a wafer.

Figure 2:
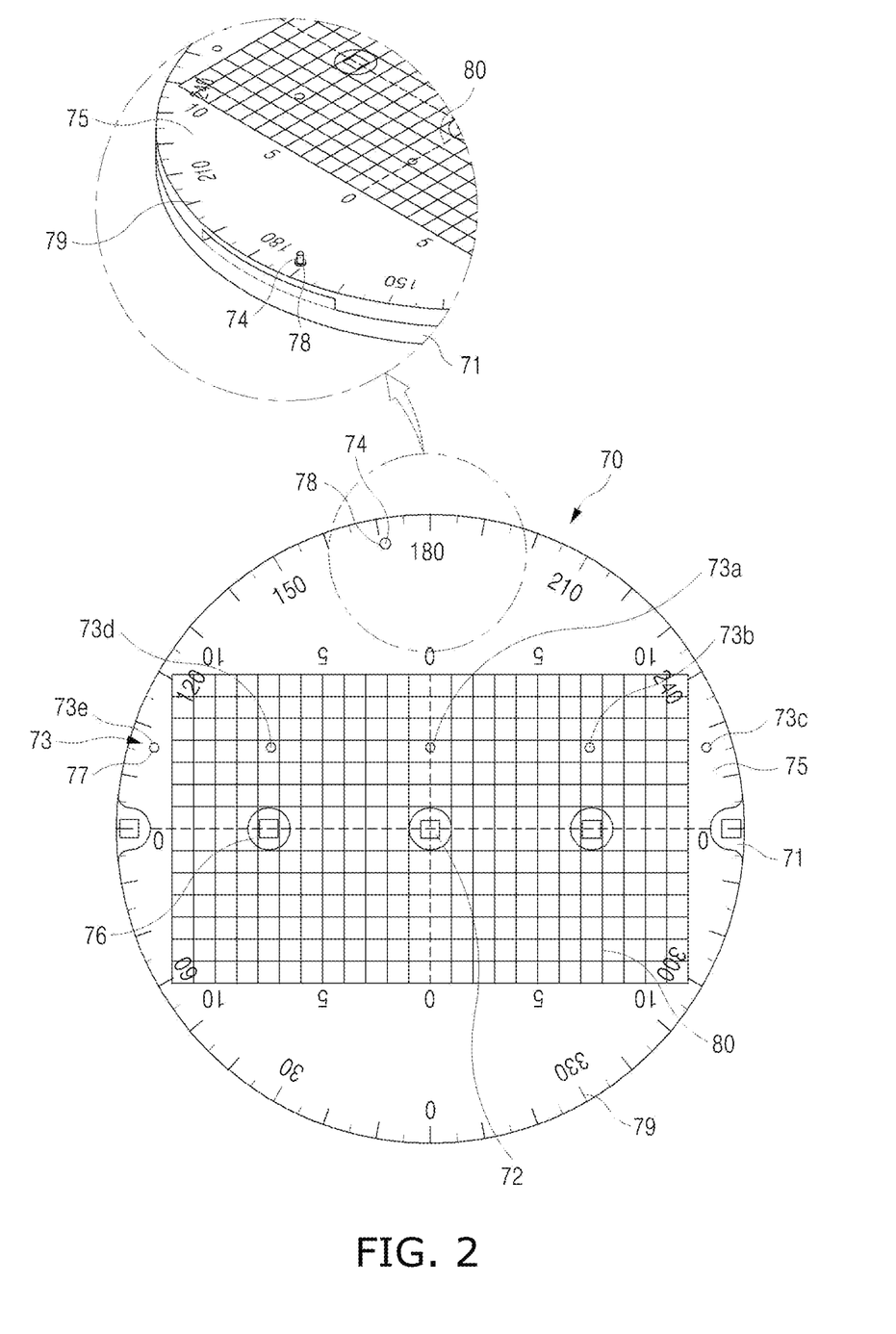
FIG. 2 is a plan view showing a jig for adjusting the installation location of a temperature sensor configured to measure the surface temperature of a wafer in a semiconductor wafer cleaning apparatus according to the present invention.

As shown in FIG. 2, a jig 70 includes: a location adjustment plate 75 which is disposed in the top thereof and adjusts the detection location of the temperature sensor 10, and a control substrate 71 which is disposed in the lower portion thereof and is intended for the operation of the location adjustment plate 75. The jig 70 is inserted into the platen 3 of each MPC 2, and is used to adjust the detection location of the temperature sensor 10. The jig 70 is formed in an approximately disk shape. Angle gradations 79 up to 360 degrees are printed and marked on the edge of the location adjustment plate 75. Furthermore, coordinate gradations 80 are printed and marked at predetermined intervals in an area extending up, down, left, and right from the central point of the location adjustment plate 75. For example, 12 vertical lines are marked in each of leftward and rightward directions from the central point of the location adjustment plate 75, and 7 lateral lines are marked in each of upward and downward directions from the central point of the location adjustment plate 75. Accordingly, the coordinate gradations 80 are arranged and marked in a grid shape at predetermined intervals in the upward, downward, leftward, and rightward directions. Additionally, the coordinate gradations 80 may have (+) values on the right and upper sides and (−) values on the left and lower sides based on the central point of the location adjustment plate 75.

Furthermore, heating elements 72 are mounted into the control substrate 71, and are heated to a predetermined temperature under the control of control substrate 71. The heating elements 72 are installed through first through holes formed at predetermined intervals to the left and right from the central point of the location adjustment plate 75. The heating elements 72 are located at the center, the left and right edges, and intermediate points between the center and the left and right edges. Accordingly, the heating elements 72, i.e., one for the center, two for the intermediate points, and two for the edges, are mounted into the control substrate 71. The heating elements 72 are located inside the first through holes 76 formed in the location adjustment plate 75. Furthermore, on/off switches 73 are mounted into the control substrate 71, and selectively turn on and off the operations of the heating elements 72. The on/off switches 73 are installed through second through holes 77 which are formed at predetermined intervals on one side of the first through holes 76 formed in the location adjustment plate 75. The on/off switches 73 are installed to selectively turn on and off the one center heating element, the two intermediate heating elements, and the two edge heating elements. Furthermore, a reset switch 74 is mounted into the control substrate 71, and initializes settings. A reset switch 74 is installed through a third through hole 78 formed on one side of the edge of the location adjustment plate 75.

Figure 7:
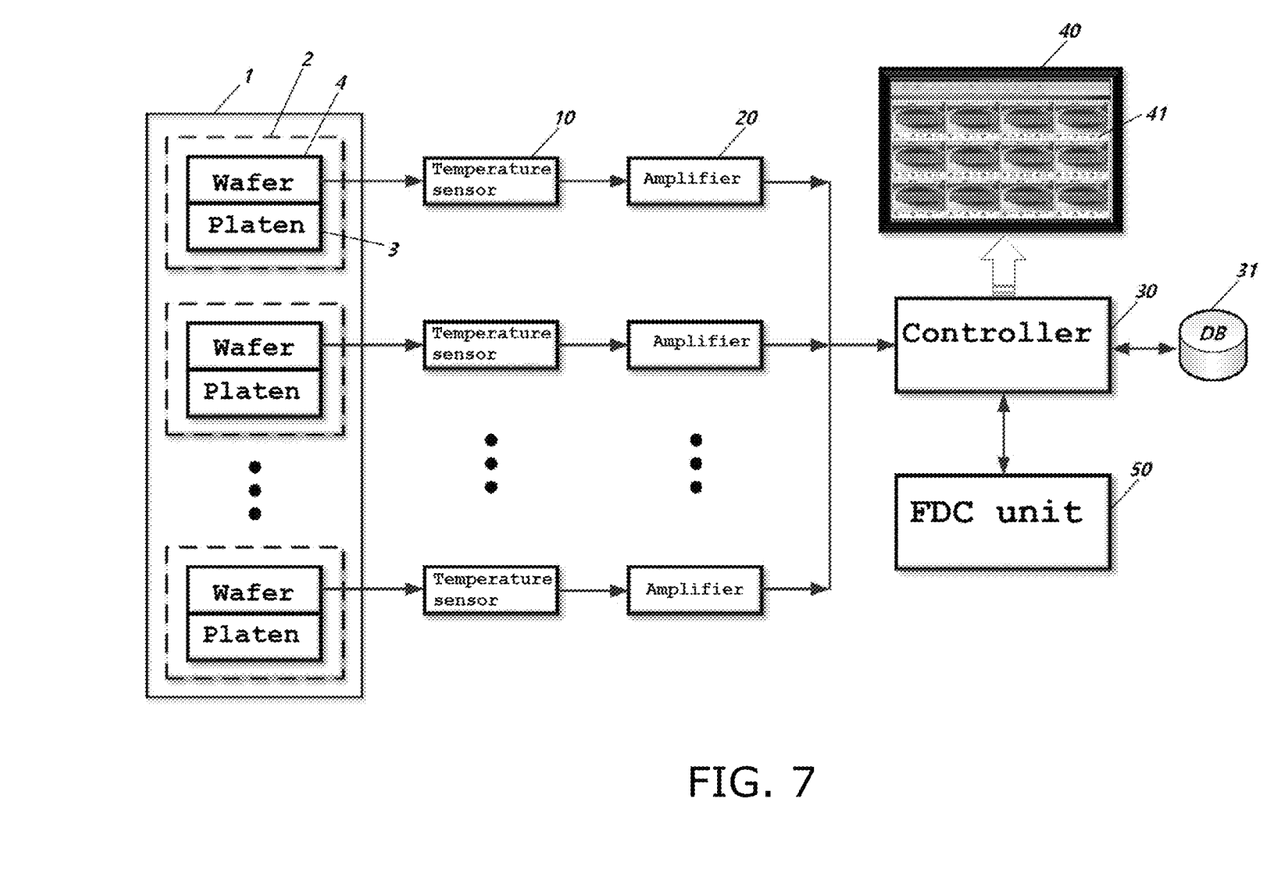
FIG. 7 is a diagram showing the configuration of a system for monitoring the surface temperature of a wafer in real time in a semiconductor wafer cleaning apparatus according to the present invention.

Meanwhile, as shown in FIG. 7, a signal detected by the temperature sensor 10 of the present invention is amplified to a predetermined level or higher and output by an amplifier 20. The amplifier 20 may filter out noise included in a signal detected by the temperature sensor 10.

The controller 30 visually displays the temperature signal, amplified to the predetermined level or higher by the amplifier 20, via a monitor 40. Additionally, a wafer surface monitoring system 41 installed on the controller 30 is an application including a graphical user interface (GUI). The wafer surface monitoring system 41 may display all the temperature data of individual MPCs 2, may display temperature data for each of the MPCs, or may entirely or selectively display temperature data in the form of a history view or recording view.

Furthermore, when the controller 30 determines that the surface temperature of a wafer detected in one of the MPCs 2 is equal to or higher than a set temperature, the wafer surface monitoring system 41 issues an alarm via the monitor 40, thereby allowing an administrator to perform post-processing on the corresponding chamber. Furthermore, the controller 30 transmits temperature data for the individual MPCs 2 to a fault detection and classification (FDC) unit 50 over a communication network. Additionally, the controller 30 stores not only the temperature data received from the MPCs 2 but also comparison, analysis and reporting information in a DB 31.

The FDC unit 50 collects and analyzes the data of the wafer surface monitoring system in real time. Additionally, the FDC unit 50 can deal with a problem occurring during wafer surface monitoring in time, can minimize the failures of the equipment by setting the PM of an appropriate period through the analysis of accumulated data, and can perform more precise analysis work by identifying correlations between different pieces of data and combining the identified correlations, thereby enabling the defect-free process of a semiconductor wafer cleaning apparatus.

A method of adjusting the installation location of a temperature sensor configured to measure the surface temperature of a wafer in the above-described semiconductor wafer cleaning apparatus according to the present invention will be described with reference to the flowchart of FIG. 6.

First, although the semiconductor wafer cleaning apparatus according to one embodiment of the present invention is a system including 12 MPCs 2, the present invention is not limited thereto. The temperature sensor 10 configured to detect the surface temperature of the wafer 4 mounted on the platen 3 is installed in each of the MPCs 2.

In order to install the temperature sensor 10, the bracket 60 is disposed on one side of the upper portion of the MPC 2. The first coupling hole 61 and the second coupling hole 62 are formed in the bracket 60. The cable is disposed through the first coupling hole 61, and the cable is fastened and supported by the first fastening member 63. The second fastening member 64 configured to fasten and support the temperature sensor 10 is disposed in the second coupling hole 62. Furthermore, the location adjustment member 65 configured to fasten and support the temperature sensor 10 is disposed under the bracket 60 to which the second fastening member 64 is coupled. The location adjustment member 65 adjusts the location of the installed temperature sensor 10 so that the installed temperature sensor 10 is directed to the surface of a set wafer. The location adjustment member 65 preferably has a structure that it can be bent upward, downward, leftward and rightward directions. The temperature sensor 10 is preferably bent at about 120 degrees with respect to the horizontal bracket 60, and is preferably disposed about 5 mm away from the bottom surface of the bracket 60.

Next, when the installation of the temperature sensor 10 is completed, the location of the temperature sensor 10 is adjusted such that the temperature sensor 10 can detect the surface temperature of a wafer 4 in real time while the wafer 4 is being cleaned after being inserted into the platen 3.

Figure 6:
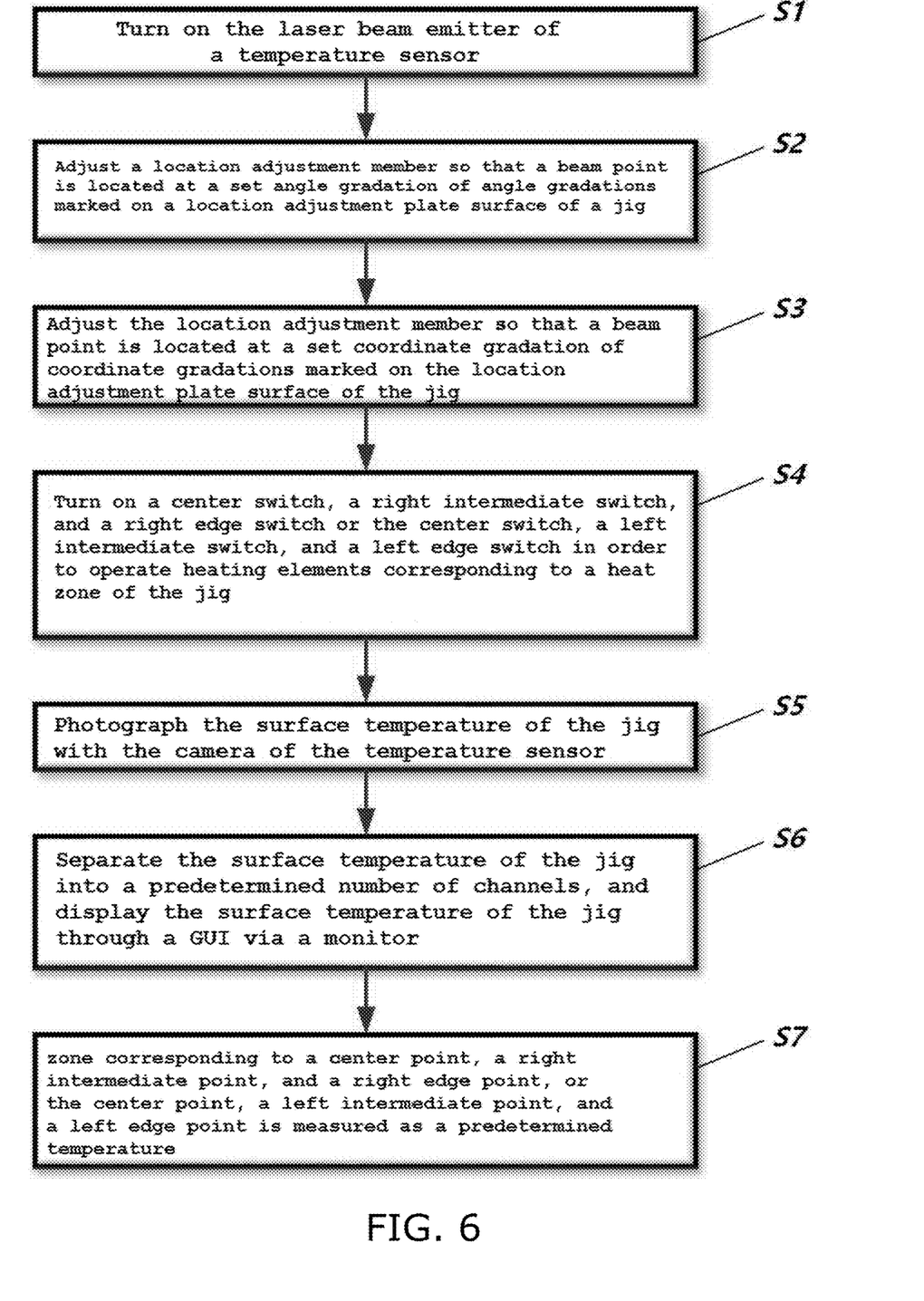
FIG. 6 is a flowchart showing the method of adjusting the location of a temperature sensor configured to measure the surface temperature of a wafer in a semiconductor wafer cleaning apparatus according to the present invention.

Referring to the flowchart of FIG. 6, the laser beam emitter 12 mounted into the temperature sensor 10 is turned on at step S1. Furthermore, the location adjustment member 65 is adjusted such that a beam point projected from the laser beam emitter 12 is located at a set angle gradation 79 of the angle gradations marked on the surface of the location adjustment plate 75 of the jig 70 at step S2. For example, the angle gradation 79 may be located at the point of about 170 or 250 degrees. Furthermore, the location adjustment member 65 is adjusted such that a beam point projected from the laser beam emitter 12 is located at the set coordinate gradation 80 of the coordinate gradations marked on the surface of the location adjustment plate 75 of the jig 70 at step S3. In this case, the coordinate gradation 80 may be (9, −4) or (−9, −4). Thereafter, the heating elements 72 corresponding to a heat zone of the jig 70 are operated. In other words, at step S4, corresponding heating elements 72 are allowed to emit heat under the control of the control substrate 71 by turning on the center switch 73a, the right intermediate switch 73b, and the right edge switch 73c, or corresponding heating elements 72 are allowed to emit heat under the control of the control substrate 71 by turning on the center switch 73a, the left intermediate switch 73d, and the left edge switch 73e.

Furthermore, the temperature of the surface of the jig 70 is photographed by the camera 11 of the temperature sensor 10 at step S5. At step S6, the signal of the photographed temperature of the surface of the jig 70 is transmitted to the controller 30 through the cable, and is separated into a predetermined number of channels, e.g., a total of 64 channels including 4 channels for each of upper and lower sides and 16 channels for each of left and right sides by the wafer surface monitoring system 41 installed on the controller 30 in the form of an application, and is displayed through a graphical user interface (GUI) via the monitor 40. Additionally, in the heat zone, the corresponding center channel, intermediate channel and edge channel are checked. In this case, a sensor value is adjusted such that the temperature of the heat zone ranges from 25 to 120° C. and an allowable range is measured as ±1° C., ±0.5° C., or ±0.25° C. at step S7.

Meanwhile, in the semiconductor wafer cleaning apparatus of the present invention, for each of the MPCs 2, in order to measure wafer surface temperature, the photographing location of the temperature sensor 10 installed in the MPC 2 may be adjusted using the angle gradations and the coordinate gradations marked on the jig 70, or the photographing location of the temperature sensor 10 may be adjusted using the same angle and coordinate gradations for all the MPCs 2 in a uniform manner. Additionally, the MPCs 2 may be classified, and the photographing location of the temperature sensor 10 may be adjusted using the same angle gradation and coordinate gradation for a corresponding chamber 2.

According to the present invention, the installation and photographing locations of the temperature sensor configured to wirelessly photograph the surface temperature of a wafer inside a chamber in a process of cleaning the wafer with the semiconductor wafer cleaning apparatus can be adjusted, thereby enabling the temperature sensor to more accurately detect the surface temperature in a process of cleaning the wafer, the surface temperature of the wafer detected by the temperature sensor can be separated into a plurality of channels and visually displayed via the monitor, a plurality of chambers installed in the semiconductor wafer cleaning apparatus can be monitored all together, the installation and photographing locations of the temperature sensor configured to wirelessly photograph the surface temperature of a polishing pad in a process of polishing a wafer can be adjusted, thereby enabling the temperature sensor to more accurately detect the surface temperature of the polishing pad in a process of polishing the wafer, and the fact that the surface of the wafer or polishing pad is heated to a predetermined temperature or higher by a chemical reaction or friction in a process of removing metallic and organic contaminants from the surface of the semiconductor wafer can be detected in real time, thereby reducing the defect rate of wafers and thus improving yield rate.

Although the present invention has been illustrated and described in conjunction with the specific embodiments above, it will be apparent to those having ordinary skill in the art that various modifications and alterations may be made without departing from the technical spirit and scope of the present invention defined in the attached claims.

What is claimed is:

1. An apparatus for adjusting an installation location of a temperature sensor configured to measure a surface temperature of a wafer in a semiconductor wafer cleaning apparatus, the apparatus comprising:
    a bracket which is disposed in an upper end of a side wall of each of multi-station processing chambers (MPCs) in a semiconductor wafer cleaning apparatus, and which is provided with a first coupling hole and a second coupling hole;
    a first fastening member which is inserted into the first coupling hole formed in the bracket, and which fastens a cable configured to transmit and receive data between the temperature sensor and a controller;
    a second fastening member which is inserted into the second coupling hole formed in the bracket, and which fastens a temperature sensor;
    a location adjustment member which is disposed under the second fastening member, and which fastens and supports the temperature sensor;
    the temperature sensor which is fixedly coupled to an end of the location adjustment member, which is provided with a camera configured to wirelessly detect temperature, and which transmits and receives data to and from the controller;
    a jig in a top of which is provided a location adjustment plate configured to adjust a detection location of the temperature sensor, in a bottom of which is coupled a control substrate configured to operate the location adjustment plate, and which is inserted into a platen of the MPC and adjusts the detection location of the temperature sensor; and
    a controller which is provided with a wafer surface monitoring system configured to separate the surface temperature, photographed by the temperature sensor, into a plurality of channels and to display the surface temperature through a graphical user interface (GUI) via a monitor.

2. The apparatus of claim 1, wherein the jig comprises:
    angle gradations which are marked on an edge of the location adjustment plate up to 360 degrees;
    coordinate gradations which are marked at predetermined intervals in an area extending up, down, left and right from a central point of the location adjustment plate;
    heating elements which are mounted into the control substrate, which emit heat up to a predetermined temperature, and which are disposed through first through holes formed at predetermined intervals to a left and right from the central point of the location adjustment plate;
    on/off switches which are mounted into the control substrate, which selectively turn on and off operations of the heating elements, and which are disposed through second through holes at predetermined intervals on one side of the first through holes; and
    a reset switch which is mounted into the control substrate, which initializes settings, and which is disposed through a third through hole formed on one side of the edge of the location adjustment plate.

3. The apparatus of claim 1, wherein the location adjustment member is hinged to the second fastening member configured to fasten the temperature sensor to the bracket to enable a location of the location adjustment member in order to be adjusted to a predetermined angle up, down, left, and right.

4. A method of adjusting an installation location of a temperature sensor configured to measure a surface temperature of a wafer in a semiconductor wafer cleaning apparatus, the method comprising:
    (a) turning on a laser beam emitter mounted into a temperature sensor;
    (b) adjusting a location adjustment member so that a beam point projected from the laser beam emitter is located at a set angle gradation of angle gradations marked on a location adjustment plate surface of a jig, and also adjusting the location adjustment member so that a beam point projected from the laser beam emitter is located at a set coordinate gradation of coordinate gradations marked on the location adjustment plate surface of the jig;
    (c) turning on a center switch, a right intermediate switch, and a right edge switch or the center switch, a left intermediate switch, and a left edge switch in order to operate heating elements corresponding to a heat zone of the jig;
    (d) separating a surface temperature of the jig, photographed by a camera of the temperature sensor, into a predetermined number of channels and displaying the surface temperature of the jig through a graphical user interface (GUI) via a monitor by means of a wafer surface monitoring system installed on a controller in an application form; and
    (e) determining a heat zone of the jig displayed through the graphical user interface via the monitor, and adjusting a sensor value so that a temperature of the heat zone corresponding to a center point, a right intermediate point, and a right edge point is measured as a predetermined temperature or so that a temperature of the heat zone corresponding to the center point, a left intermediate point, and a left edge point is measured as a predetermined temperature.

5. The method of claim 4, wherein the wafer surface monitoring system performs adjustment so that the temperature of the heat zone corresponding to the center point, the right intermediate point, the left intermediate point, the right edge, and the left edge ranges from 25 to 120° C. and an allowable range is measured as a range of ±1 to 0.25° C.

* * * * *